(12) United States Patent
Johnson, Jr.

(10) Patent No.: US 7,542,268 B2
(45) Date of Patent: Jun. 2, 2009

(54) MODULAR ELECTRONIC SYSTEMS AND METHODS USING FLEXIBLE POWER DISTRIBUTION UNIT INTERFACE

(75) Inventor: Robert W. Johnson, Jr., Raleigh, NC (US)

(73) Assignee: Eaton Corporation, Cleveland, OH (US)

( * ) Notice: Subject to any disclaimer, the term of this patent is extended or adjusted under 35 U.S.C. 154(b) by 68 days.

(21) Appl. No.: 11/378,054

(22) Filed: Mar. 17, 2006

(65) Prior Publication Data

US 2007/0217128 A1 Sep. 20, 2007

(51) Int. Cl.
*H05K 7/20* (2006.01)

(52) U.S. Cl. ............... 361/622; 361/624; 361/628; 361/642; 361/687; 174/50; 174/59

(58) Field of Classification Search ......... 361/622–624, 361/642, 648, 695, 628, 687, 690, 725, 747; 174/38, 50, 59–60, 541; 439/652, 535, 114; 307/10.1, 26, 66, 112

See application file for complete search history.

(56) References Cited

U.S. PATENT DOCUMENTS

| | | | | |
|---|---|---|---|---|
| 3,054,024 | A | * | 9/1962 | Van Dillen et al. ............ 361/747 |
| 5,675,194 | A | * | 10/1997 | Domigan ..................... 307/147 |
| 6,201,319 | B1 | * | 3/2001 | Simonelli et al. ............. 307/26 |
| 6,301,095 | B1 | * | 10/2001 | Laughlin et al. ............. 361/624 |
| RE37,592 | E | * | 3/2002 | Alden et al. ................. 361/622 |
| 6,442,017 | B1 | * | 8/2002 | Ewing et al. ................ 361/628 |
| 6,844,716 | B1 | * | 1/2005 | Lundberg et al. ............ 324/142 |
| 6,867,966 | B2 | * | 3/2005 | Smith et al. ................. 361/687 |
| 6,882,530 | B2 | * | 4/2005 | Cyphers et al. ............. 361/686 |
| 6,967,283 | B2 | | 11/2005 | Rasmussen et al. |
| 7,046,514 | B2 | * | 5/2006 | Fink et al. ................... 361/695 |
| 7,116,550 | B2 | * | 10/2006 | Ewing et al. ................ 361/623 |
| 7,145,772 | B2 | * | 12/2006 | Fink ........................... 361/695 |
| 7,196,900 | B2 | * | 3/2007 | Ewing et al. ................ 361/642 |
| 7,252,524 | B1 | * | 8/2007 | Johnson et al. ............. 439/210 |
| 2002/0187682 | A1 | * | 12/2002 | Lincoln et al. ............. 439/652 |
| 2003/0223196 | A1 | * | 12/2003 | Smith et al. ................. 361/687 |
| 2004/0000815 | A1 | | 1/2004 | Pereira |
| 2004/0130868 | A1 | * | 7/2004 | Schwartz et al. ............ 361/687 |
| 2004/0231875 | A1 | | 11/2004 | Rasmussen et al. |
| 2005/0024825 | A1 | * | 2/2005 | Smith et al. ................. 361/687 |

(Continued)

OTHER PUBLICATIONS

Extended European Search Report and Written Opinion (8 pages) corresponding to European Application No. 07005481.2; Dated: Mar. 2, 2009.

*Primary Examiner*—Jayprakash N Gandhi
*Assistant Examiner*—Courtney Smith
(74) *Attorney, Agent, or Firm*—Myers Bigel Sibley & Sajovec, P.A.

(57) ABSTRACT

A modular electronic equipment system includes a plurality of equipment racks. Each equipment rack includes a equipment rack frame configured to receive and support electronic equipment, a power input cable having a first end fixedly attached to the equipment rack frame and configured to be electrically coupled to electronic equipment supported by the equipment rack frame to provide power thereto and a first connector attached to a second end of the power input cable. The system further includes a power distribution rack. The power distribution rack includes a power distribution rack frame and a plurality of second connectors supported by the power distribution rack frame and configured to pluggably mate with the first connectors of the equipment racks.

17 Claims, 9 Drawing Sheets

U.S. PATENT DOCUMENTS

| | | | |
|---|---|---|---|
| 2005/0068716 A1* | 3/2005 | Pereira | 361/624 |
| 2005/0083651 A1* | 4/2005 | Smith et al. | 361/687 |
| 2005/0094357 A1 | 5/2005 | Ewing et al. | |
| 2005/0162019 A1* | 7/2005 | Masciarelli et al. | 307/66 |
| 2005/0185363 A1* | 8/2005 | Rasmussen et al. | 361/624 |
| 2006/0005985 A1* | 1/2006 | L'Henaff et al. | 174/50 |
| 2007/0159775 A1* | 7/2007 | Ewing et al. | 361/642 |
| 2007/0165377 A1* | 7/2007 | Rasmussen et al. | 361/695 |

* cited by examiner

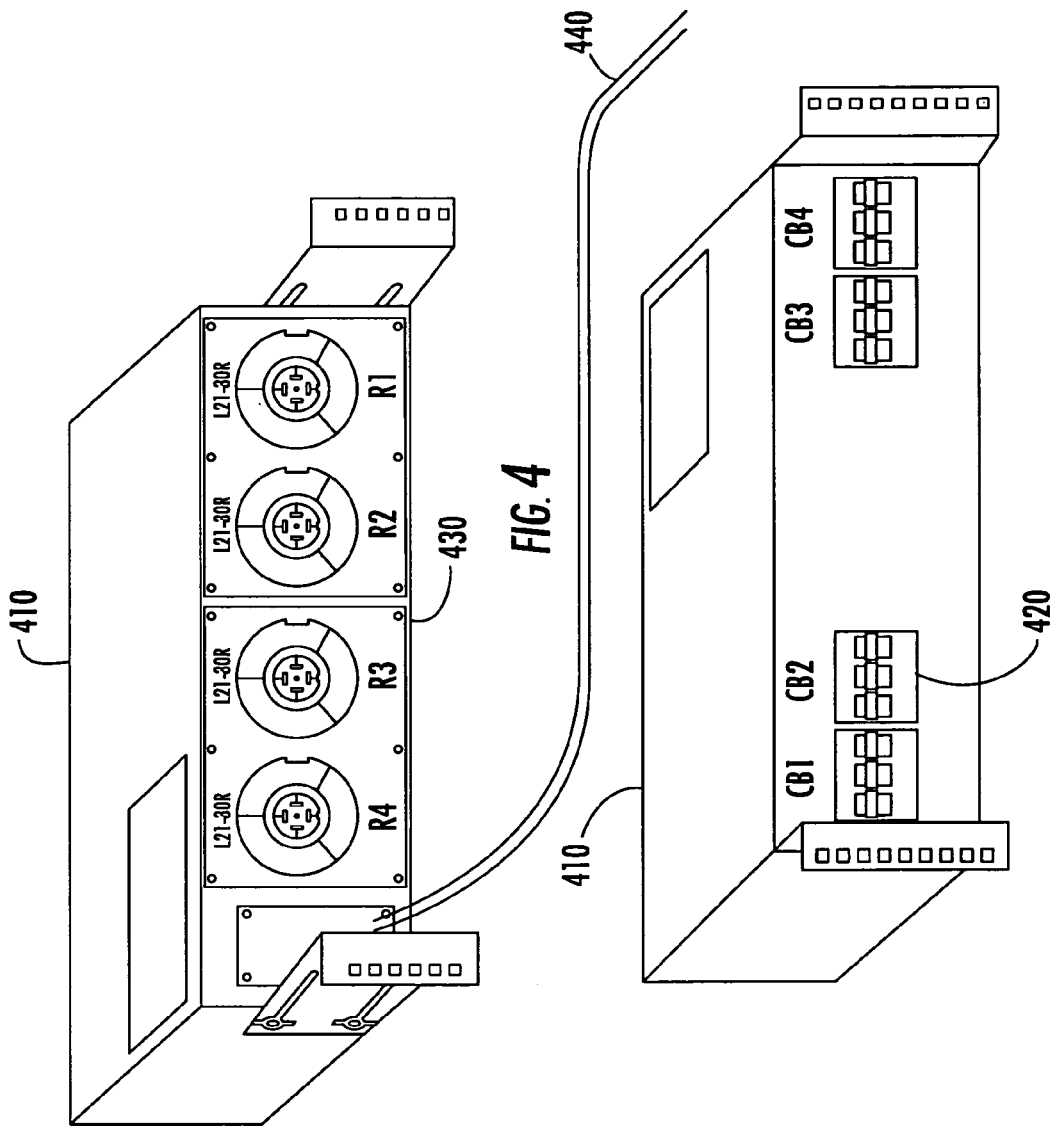

MODULAR ELECTRONIC SYSTEMS AND METHODS USING FLEXIBLE POWER DISTRIBUTION UNIT INTERFACE

BACKGROUND OF THE INVENTION

The present invention relates to power distribution apparatus and methods and, more particularly, to power distribution for modular electronic systems.

Internet server farms and other large-scale data processing installations often include a large number of computers, peripherals and communications devices that host web sites, process transactions, manage financial and personal information, and other data processing and communications tasks. These installations are often constructed in a modular fashion, e.g., an installation may include a battery of standardized equipment racks (e.g., 19-inch racks) in which multiple computers and data communications devices, e.g., routers, hubs and the like, may be housed. Similar modular architectures may be used in telecommunications systems.

Typically, it is desirable for such installations to have high availability and reliability, such that, for example, data integrity and/or access is preserved even during disruptive events, such as power failures arising from storms, system overloads or other disturbances. Accordingly, such installations typically are powered by uninterruptible power supplies (UPSs), which can improve power quality and/or provide back up power to computing and communications equipment from an alternative source, such as a battery, generator or fuel cell, when utility power fails or is degraded.

Modular UPS systems have been proposed for such installations. U.S. Pat. No. 6,967,283 to Rasmussen et al. describes systems and methods for installing computer equipment and power distribution equipment in facilities. Each of a plurality of equipment racks has a power input to receive power for equipment contained therein. A power distribution rack provides power to the equipment racks and includes a power distribution panel and a plurality of output power cables. A first end of an output cable is coupled to the power distribution panel and a second end of the output cable has a mating connector that pluggably mates with the power input of an equipment rack.

While such an arrangement may have benefits, there is an ongoing need for improved power distribution techniques for such applications.

SUMMARY OF THE INVENTION

In some embodiments of the present invention, a modular electronic equipment system includes a plurality of equipment racks. Each equipment rack includes an equipment rack frame configured to receive and support electronic equipment, a power input cable having a first end fixedly attached to the equipment rack frame and configured to be electrically coupled to electronic equipment supported by the equipment rack frame to provide power thereto and a first connector attached to a second end of the power input cable. The system further includes a power distribution rack. The power distribution rack includes a power distribution rack frame and a plurality of second connectors supported by the power distribution rack frame and configured to pluggably mate with the first connectors of the power. input cables.

In some embodiments of the present invention, the power distribution rack further includes a plurality of circuit interruption devices supported by the power distribution rack frame, electrically coupled to the second connectors and configured to control provision of power to the second connectors. The circuit interruption devices may include a plurality of circuit breakers accessible from a first face of the power distribution rack frame, and the plurality of second connectors may be accessible from a back or other face of the power distribution rack frame. The system may further include an uninterruptible power supply (UPS) rack including a UPS electrically coupled to the circuit interruption devices. The power distribution rack may further include a bypass switch supported by the power distribution rack frame and electrically coupled to the circuit interruption devices and the UPS. The power distribution rack may also include a transformer supported by the power distribution rack frame and electrically coupled to the bypass switch.

In some embodiments of the present invention, each of the equipment racks includes a power distribution network supported by the equipment rack frame, electrically coupled to the first end of the power input cable and configured to distribute power to electronic equipment supported by the equipment rack frame. For example, the power distribution network may include a plurality of equipment power connectors configured to pluggably mate with power connectors of the electronic equipment, and the power input cable may be electrically coupled to the plurality of equipment power connectors. The second connectors of the power distribution rack may be visibly grouped according to at least one index, such as phase, power source, or the like.

Further embodiments of the present invention provide methods of providing power distribution in an electronic system. A plurality of equipment racks is provided, each including a equipment rack frame configured to receive and support electronic equipment, a power input cable having a first end fixedly attached to the equipment rack frame and configured to be electrically coupled to electronic equipment supported by the equipment rack frame to provide power thereto and a first connector attached to a second end of the power input cable. A power distribution rack is also provided, the power distribution rack including a power distribution rack frame and a plurality of second connectors fixedly attached to the power distribution rack frame. The second connectors are mated with the first connectors of the power input cables.

BRIEF DESCRIPTION OF THE DRAWINGS

FIGS. 4 and 5 illustrate a power distribution assembly for use in a power distribution rack according to further embodiments of the present invention.

DETAILED DESCRIPTION

Figure 1:
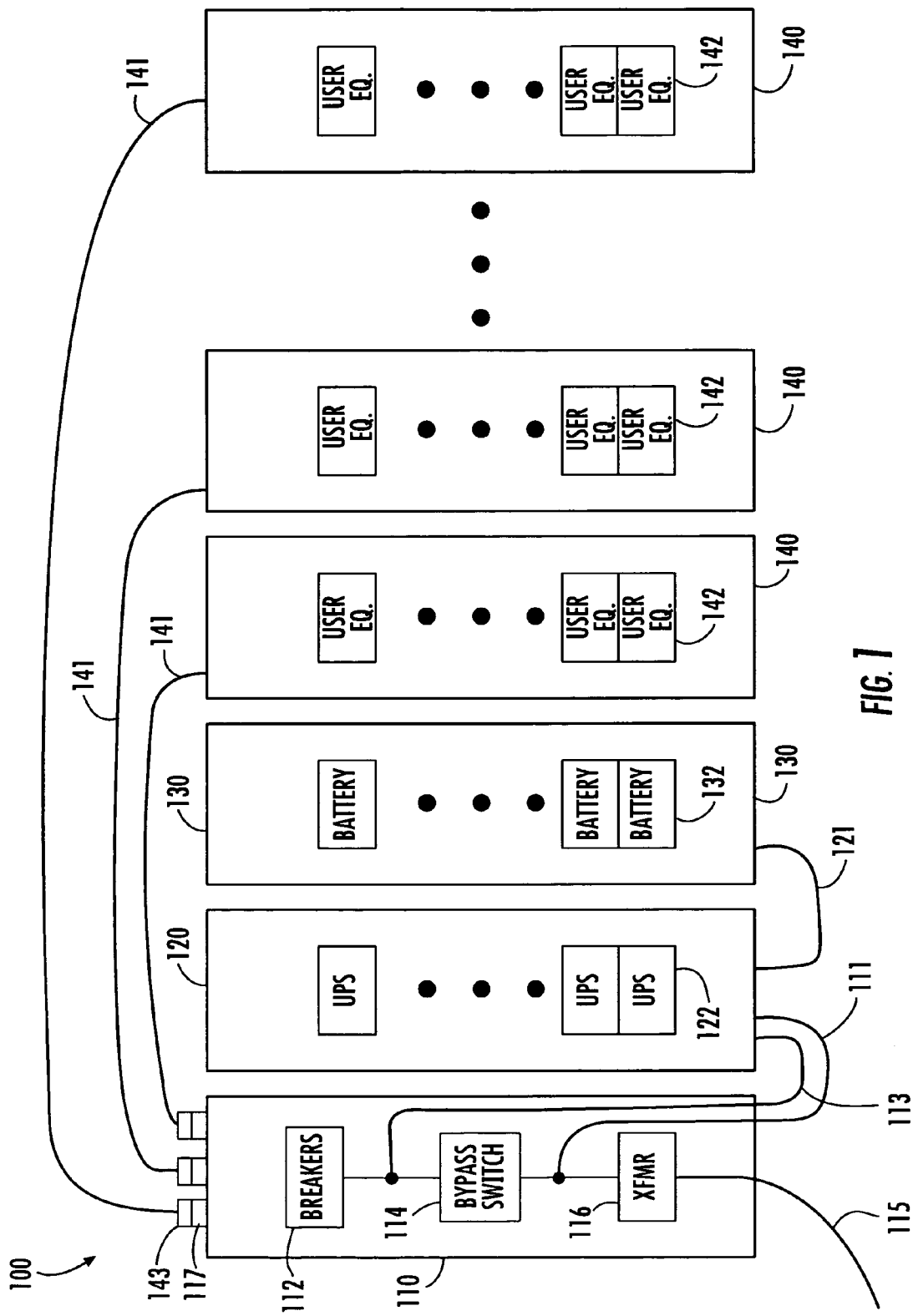
FIG. 1 illustrates a modular electronic system according to some embodiments of the present invention.

Specific exemplary embodiments of the invention now will be described with reference to the accompanying drawings.

This invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular exemplary embodiments illustrated in the accompanying drawings is not intended to be limiting of the invention. In the drawings, like numbers refer to like elements.

As used herein, the singular forms "a", "an" and "the" are intended to include the plural forms as well, unless expressly stated otherwise. It will be further understood that the terms "comprises," "includes," "comprising" and/or "including," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. Furthermore, "connected" or "coupled" as used herein may include wirelessly connected or coupled. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a modular electronic system 100 according to some embodiments of the present invention. The system includes a plurality of equipment racks 140 and a power distribution rack 110 that is configured to distribute power to the equipment racks 140. The system 100 also includes a UPS rack 120 and a battery rack 130, which are configured to interoperate with the power distribution rack 110. As shown, the UPS rack 120 may include one or more UPSs 122, and is configured to receive utility power from the power distribution rack 110 over a power input cable 111 and to provide power back to the power distribution rack 110 over a power output cable 113. For example, the UPS rack 120 may provide conditioned and/or backup power, e.g., from batteries 132 in the battery rack 130 via a battery cable 121, to the power distribution unit 110 for distribution to the equipment racks 140. It will be appreciated that, although FIG. 1 illustrates a battery rack 130 and batteries 132 separate from the UPSs 122, in some embodiments of the invention, the UPSs 122 may include integrated batteries, which may or may not be supported by additional external batteries.

The equipment racks 140 are configured to house or otherwise support electronic equipment 142, such as server computers, routers, disk drives, tape drives or other computing or communications hardware. Each of the equipment racks 140 includes one or more power input cables 141, each having a first end fixedly attached to the equipment rack 140, e.g., using a cable clamp, strain relief or other fixed mounting structure. Each power input cable 141 has a connector 143 is attached at a second end. It will be understood that each equipment rack 140 may have more than one power input cable 141. For example, multiple power input cables 141 may be provided to meet particular load requirements and/or to provide connection to redundant power sources, as described in greater detail below. The power input cables 141 may have respective lengths that correspond to respective distances between the respective equipment racks 140 and the power distribution rack 110, as also discussed in greater detail below. Each connector 143 is configured to be pluggably connected to a mating connector 117 of the power distribution rack 110 to provide power to the equipment racks 140.

This approach can provide flexibility and scalability. In particular, when an installation is first laid out, the number of equipment racks 140 and power distribution racks 110, UPS racks 120 and/or battery racks 130 and the relative arrangement thereof may be determined, and cable lengths for the equipment racks 140 may be specified and fabricated as part of the construction of the equipment racks 140 at the factory. Prefabricated equipment racks 140 and prefabricated power distribution, UPS and/or battery racks 110, 120, 130 may be provided to the installation site, where the equipment racks 140 may be populated with equipment and integrated with the power distribution rack 110 by pluggably mating the connectors 117, 143.

In other embodiments, the power distribution rack 110, UPS rack 120 and/or battery rack 130 may also be constructed in a modular fashion, such that they may be constructed component-by-component at the factory and/or field. For example, these power equipment racks may use a standard form factor (e.g., 19-inch) rack that may be populated with power modules and modular interconnect assemblies as shown, for example, in a copending U.S. patent application Ser. No. 11/378,140, entitled "Modular UPS Systems and Methods Using Modular Interconnect Assemblies," filed concurrently herewith and incorporated herein by reference in its entirety.

An installation may be expanded by addition of new equipment racks 140 and/or power racks, which may be prefabricated at the factory based on knowledge of the existing layout. Circuit layout, e.g., distribution of loads among phases and/or branch circuits, may also be easily modified by changing connections among the connectors 117, 143 at the power distribution rack 110. Such flexibility may be valuable, for example, when a UPS module or other piece of equipment needs to be removed for maintenance and/or if the nature of the load changes (e.g., changes caused by network reconfiguration and/or expansion). It will be understood that the connectors 117, 143 may have any of a number of different configurations and/or form factors, including blade/receptacle arrangements or other structures that provide pluggable electrical coupling.

As shown in FIG. 1, the power distribution rack 110 may also include a plurality of circuit interruption devices, here shown as circuit breakers 112, which are coupled to the connectors 117. In the illustrated embodiments, the breakers 112 are coupled to a bypass switch 114, which is also coupled to a transformer 116, here shown as receiving power from a utility source 115. The bypass switch 114 is operative to bypass one or more UPSs 122 in the UPS rack 120 such that the breakers 112 may be tied directly to the transformer 116. In other embodiments of the invention, components, such as the breakers 112, bypass switch 114 or transformer 116, shown as included in the power distribution rack 110 in FIG. 1, may be provided in a different rack or enclosure, and coupled to the power distribution rack 110 via cabling. For example, in some embodiments of the present invention, the bypass switch 114 and/or transformer 116 may be included in the UPS rack 120 or in another rack.

Figure 2:
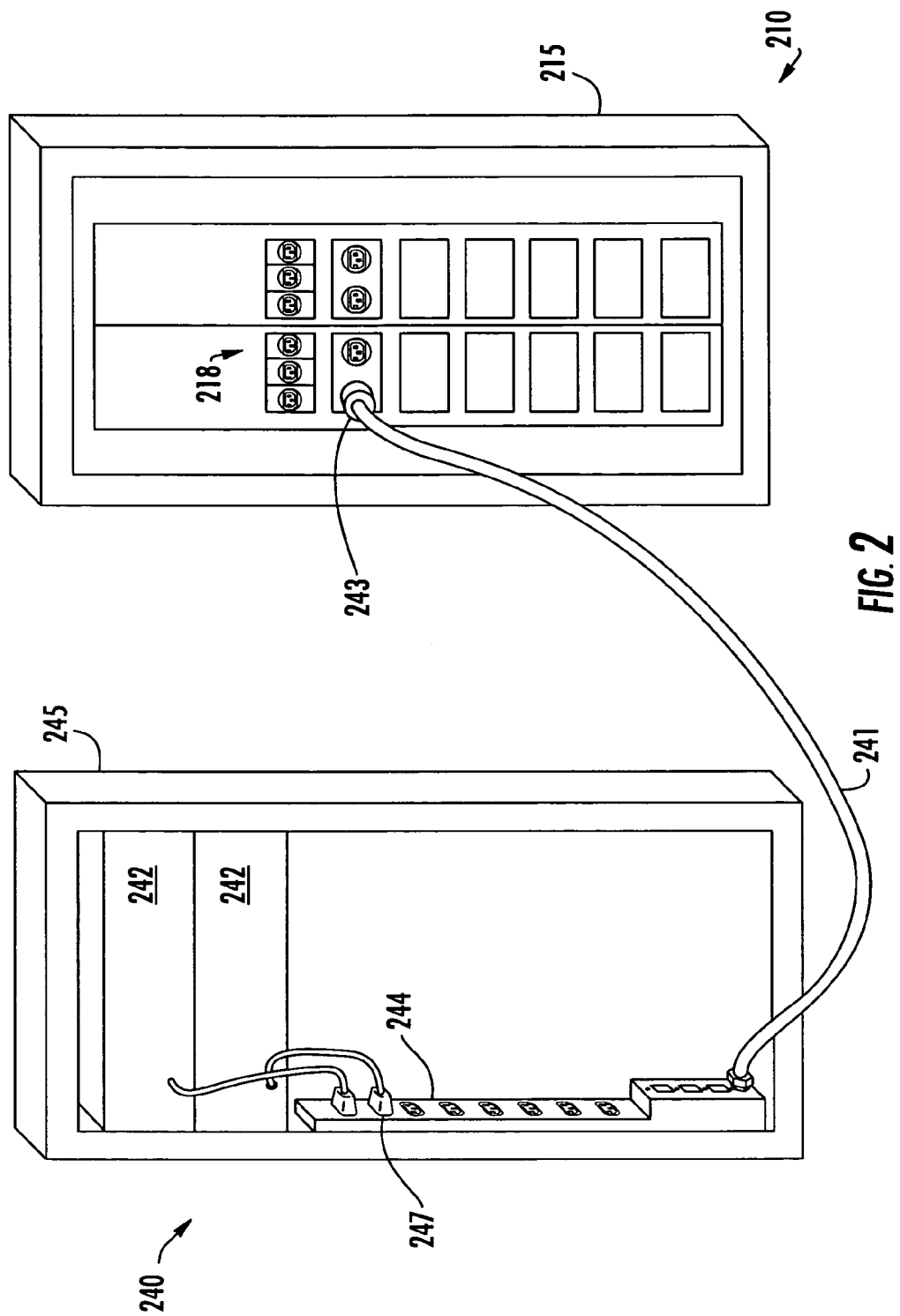
FIGS. 2 and 3 illustrates connections between an equipment rack and a power distribution rack according to some embodiments of the present invention.
Figure 3:
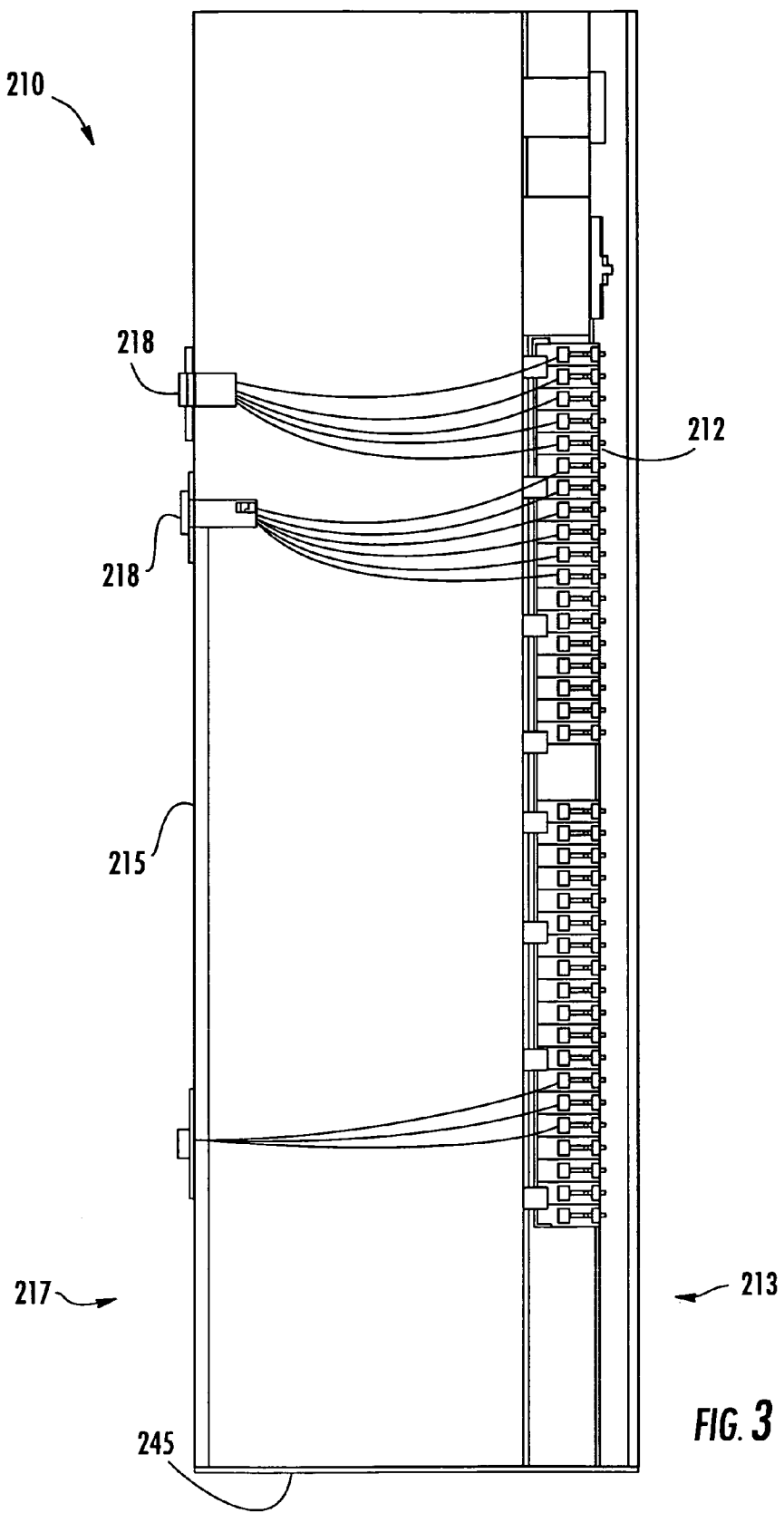

FIG. 2 provides a rear prospective view of a power distribution rack 210 and an equipment rack 240 according to further embodiments of the present invention. FIG. 3 provides a side view of the power distribution rack 210. The power distribution rack 210 includes a frame 215, for example, a housing, structural support members and/or other frame components. The frame 215 supports a breaker panel 212, which is accessible at a front face 213 of the power distribution rack 210. The frame 215 also supports a plurality of outlets 218 accessible at a back face 217 of the power distribution rack 210.

The equipment rack 240 includes a frame 245 that supports electronic equipment 242, for example, computers, routers, hubs, disk drives, and/or other computing or communications equipment. An outlet assembly 244 mounted in and/or on the frame 245 includes outlets 247 that are configured to pluggably mate with power input cables from the electronic equipment 242, thus providing a power distribution network for the equipment rack 240. A first end of a power input cable 241 of the equipment rack 240 is fixedly attached to the power outlet assembly 244. A connector 243 is attached at a second end of the power input cable 241. The connector 243 is configured to pluggably mate with one of the outlets 218 of the power distribution rack 210. Although a single power input cable 241 is shown, it will be appreciated that the equipment rack 240 may have more than one power input cable 241. For example, the equipment rack 240 may include multiple outlet assemblies like the assembly 244, with respective power input cables fixedly attached thereto.

It will be understood that the configuration shown in FIGS. 2 and 3 is provided for purposes of illustration, and that a wide variety of other configurations fall within the scope of the present invention. For example, although FIGS. 2 and 3 illustrate placement of breakers 212 and outlets 218 and on respective front and back faces 213, 217 of a power distribution rack, either of the outlets 218 or breakers 212 may be provided on a side face of a power distribution rack, e.g., breakers could be accessible on the side for a power distribution rack placed at the end of a row of racks.

FIGS. 4 and 5 illustrate another exemplary configuration of circuit breakers 420 and output connectors 430 for a power distribution rack according to further embodiments of the present invention. In particular, the circuit breakers 420 and outlets may be mounted on respective front and back faces of a power distribution assembly 410 (e.g., a breaker panel) that is configured to be mounted in a power distribution rack frame. A power cable 440 may extend from the power distribution assembly 410 for connection to a power source, e.g., to a bypass switch and/or UPS as illustrated in FIG. 1. Such a connection may be made, for example, via a modular power interconnect assembly as described with reference to FIGS. 7 and 8 below.

Figure 6:
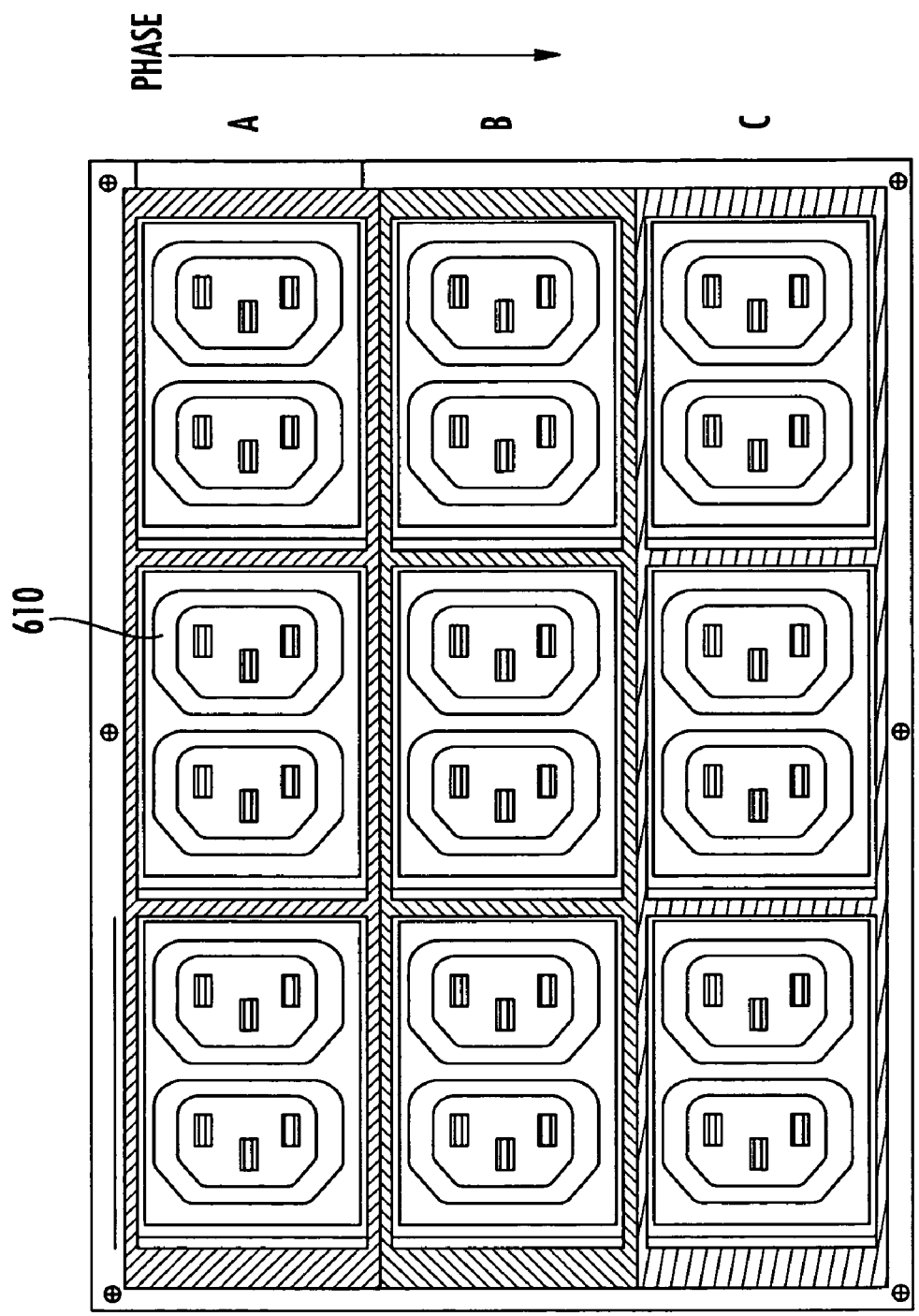
FIG. 6 illustrates an exemplary grouping of connectors for a power distribution rack according to some embodiments of the present invention.

According to some embodiments of the present invention, connectors of a power distribution rack, such as the connectors of the power distribution racks 110, 210 shown in FIGS. 1 and 2, may be provided in an arrangement in which connectors are visibly grouped according to breaker (branch), phase and/or other indices using distinctive marking, such as color coding. For example, as shown in FIG. 6, outlet connectors 610 may be grouped by phase (A,B,C). Such an approach may make balancing and rebalancing of loads more convenient, as multiple power connections may be provided at a single location and their phase and/or branch circuit identity clearly identified to personnel. This may favorably contrast with some modular systems in which pluggable power connections are provided in a distributed fashion at multiple individual equipment racks fed by a single power distribution rack. It will be appreciated that the grouping shown in FIG. 6 is provided for purposes of illustration and that other groupings, e.g., groupings by branch or power source, may also be provided in some embodiments of the present invention.

Figure 7:
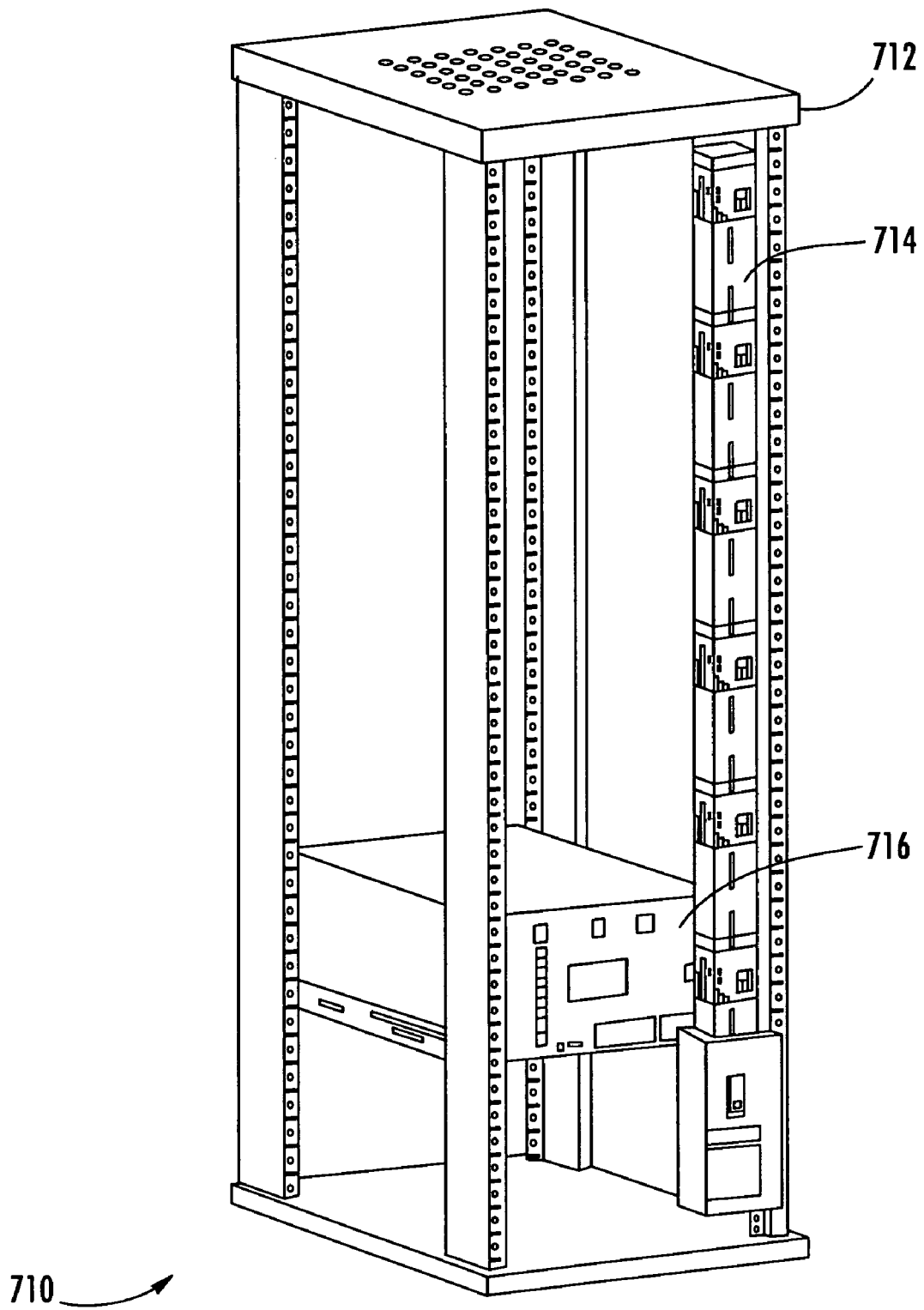
FIG. 7 illustrates a modular UPS rack according to additional embodiments of the present invention.
Figure 8:
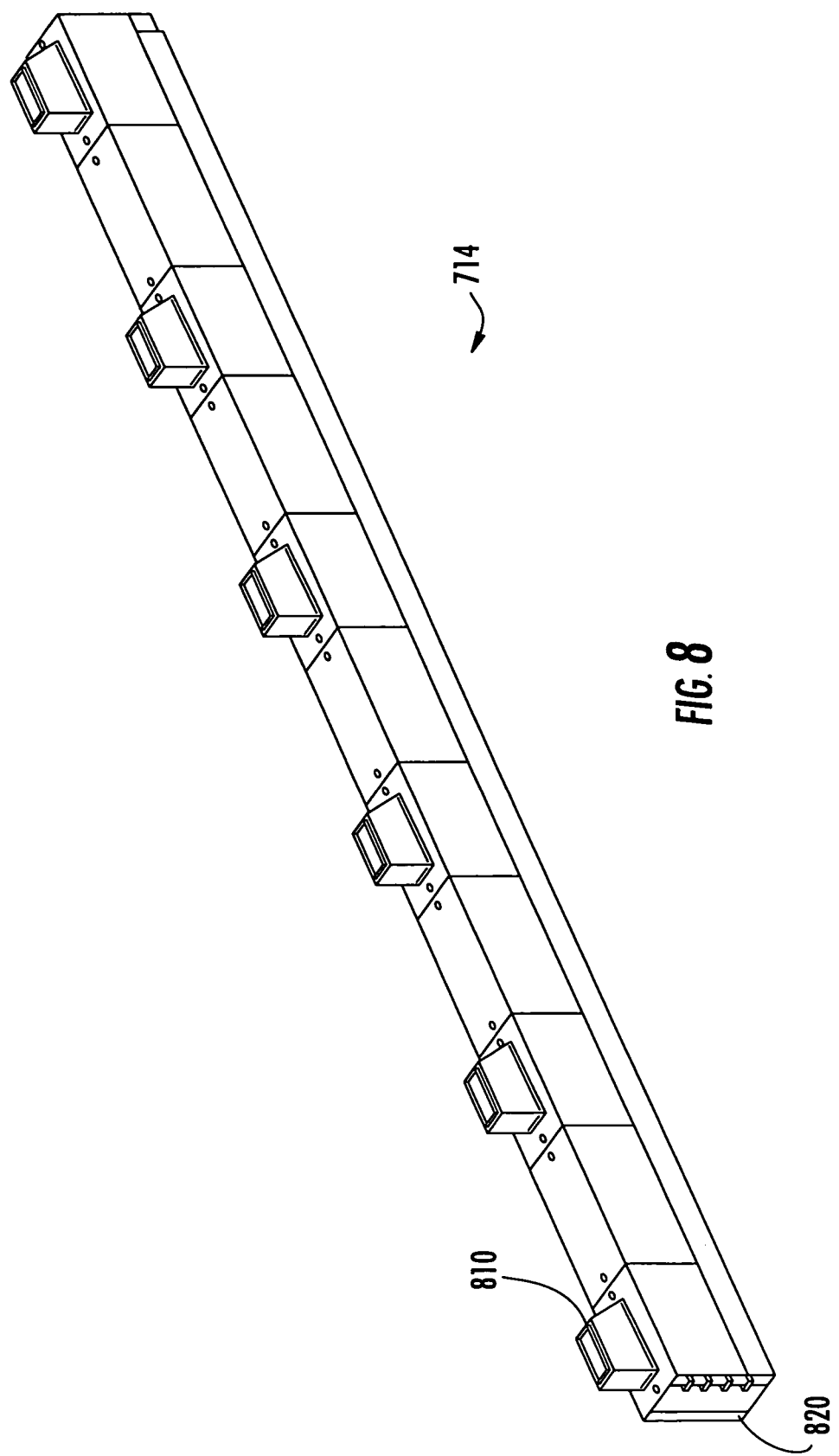
FIG. 8 illustrates a power interconnect assembly according to some embodiments of the present invention.

FIG. 7 illustrates an exemplary configuration for a UPS rack 710 that may be used in a modular electronic system, such as the system 100 of FIG. 1, according to further embodiments of the present invention. The UPS rack 710 includes a frame 712 that is configured to support one or more UPS modules 716. The UPS modules 716 are electrically coupled to a modular power interconnect assembly 714, which is shown in greater detail in FIG. 8. In some embodiments of the present invention, the power interconnect assembly 714 may be configured to provide AC and/or DC power connections for the UPS modules 716, which, as shown in FIG. 8, may be connected to the power interconnect assembly 714 via connectors 810. To provide safety for hot coupling and decoupling, the connectors 810 may be, for example, "fingerproof" connectors, such as the Power Pak® line of connectors produced by Anderson Power Products. As further shown in FIG. 8, DC and/or AC power connections for the power interconnect assembly 714 may be provided, for example, via an end 820 of the power interconnect assembly 714.

Similar rack-based modular interconnect approaches may be used with other components according to further embodiments of the present invention. For example, the power distribution rack 110 illustrated in FIG. 1 may incorporate a modular interconnect assembly along the lines of the power interconnect assembly 714 to connect the breaker panel 112, bypass switch 114 and transformer 116, and similar structures may be used, for example, for battery banks and other UPS system components. Modular power interconnect assemblies and power module rack configurations using such assemblies that may be used in accordance with some embodiments of the present invention are generally described in the aforementioned U.S. patent application Ser. No. 11/378,140, entitled "Modular UPS Systems and Methods Using Modular Interconnect Assemblies."

Figure 9:
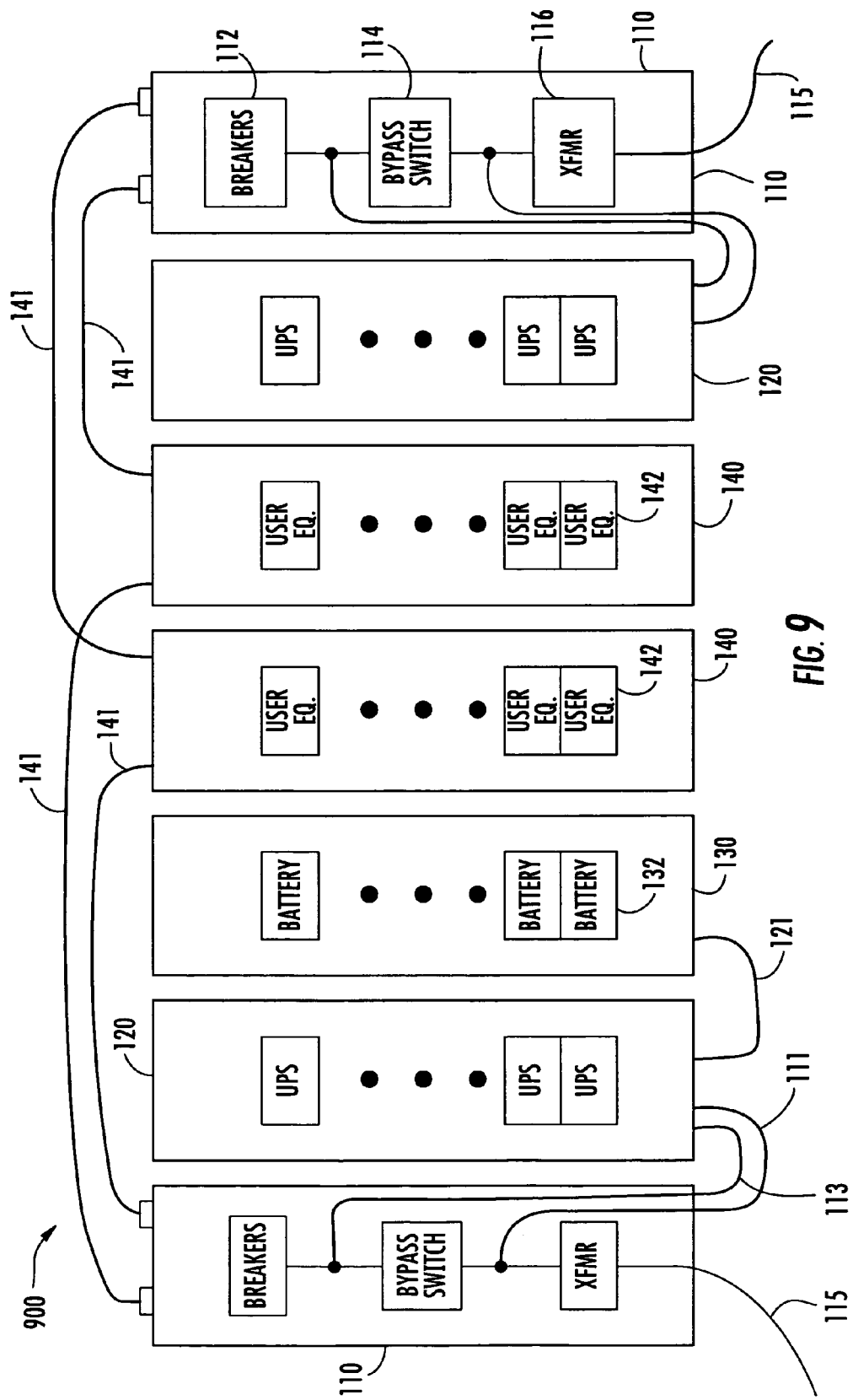
FIG. 9 illustrates a modular electronic system according to some embodiments of the present invention.

Power distribution apparatus and methods according to further embodiments of the present invention may readily support a variety of different power distribution configurations. For example, FIG. 9 illustrates a modular electronic system 900 according to further embodiments of the present invention in which equipment racks 140 are served from multiple power sources. The system 900 includes many of the components illustrated in FIG. 1, with like elements indicated by like reference numbers. The system 900 further differs in that it provides power to the equipment racks 140 from multiple power distribution racks 110, supported by multiple UPS racks 120. Such a configuration may be used, for example, in applications in which the load equipment 142 is configured to receive power from redundant power sources. For example, some server rack implementations may include multiple DC power supplies that have DC outputs that are paralleled for redundant DC power provision to server modules in the server rack. In such embodiments, respective UPS-backed AC power sources, such as the respective power distribution racks 140 shown in FIG. 9, may be coupled to respective ones of the multiple DC power supplies in the server rack.

Figure 10:
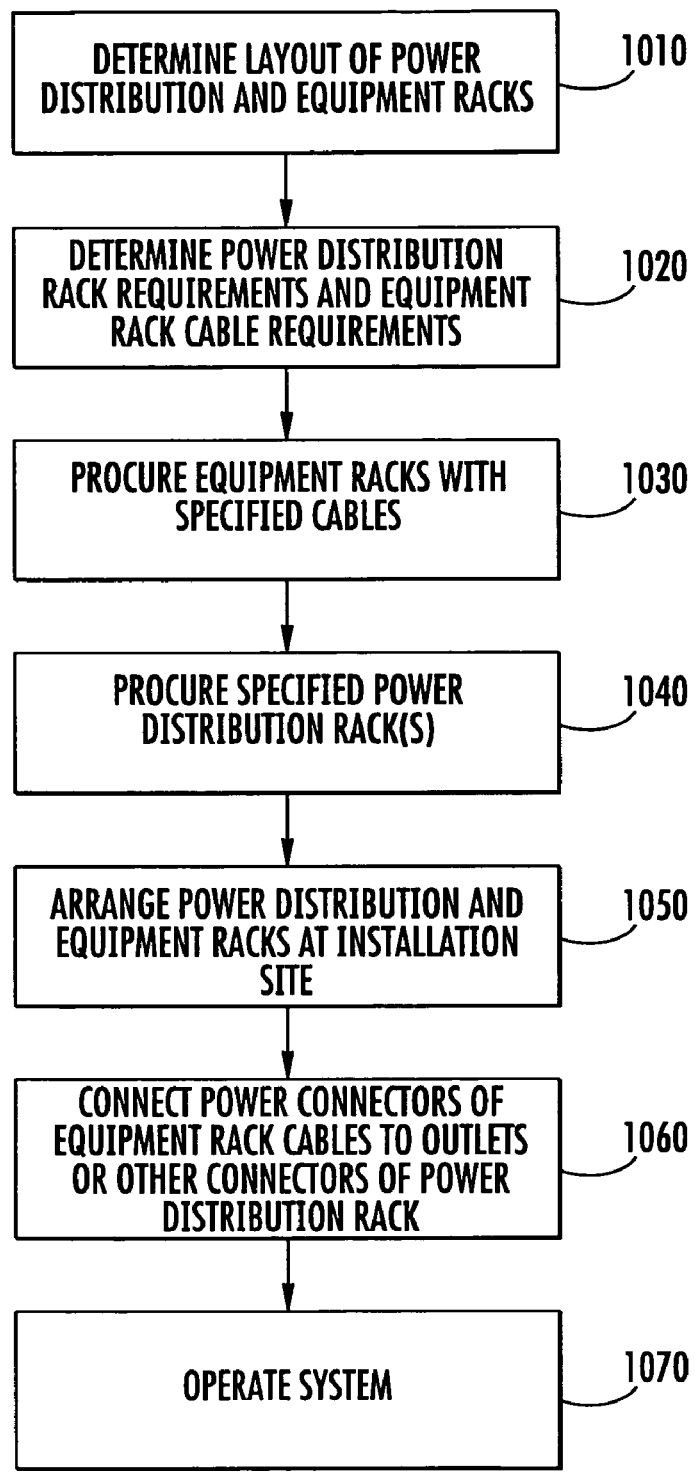
FIG. 10 is a flowchart illustrating exemplary operations for providing a power distribution in an electronic system according to further embodiments of the present invention.

FIG. 10 is a flowchart illustrating exemplary operations for providing power distribution in an electronic system, such as a data processing or telecommunications system, according to some embodiments of the present invention. A layout of power distribution and equipment racks is determined (block 1010). Power distribution rack requirements, e.g., number and size of conductors, breaker requirements, and the like, are determined, along with the power input cable requirements for the equipment racks that are to be connected to the power distribution racks (block 1020). For example, in this step, the number and length of power input cables of each of the equipment racks may be determined based on the layout of the system. Upon determination of these specifications, equipment racks with the appropriate power input cables and power distribution racks with the appropriate capabilities may be procured (blocks 1030, 1040). The procured racks are then arranged at the installation site (block 1050). The connectors of the equipment rack cables are then mated to appropriate connectors of the power distribution racks (block 1060). As noted above, the mating may be based on loading or other considerations. After the connectors are mated, the system may be operated, e.g., the equipment racks may be energized (block 1070).

In the drawings and specification, there have been disclosed exemplary embodiments of the invention. Although specific terms are employed, they are used in a generic and descriptive sense only and not for purposes of limitation, the scope of the invention being defined by the following claims.

That which is claimed is:

1. A modular electronic equipment system comprising:
   a plurality of equipment racks, each comprising:
      an equipment rack frame configured to receive and support electronic equipment;
      a power input cable having a first end fixedly attached to the equipment rack frame and configured to be electrically coupled to electronic equipment supported by the equipment rack frame; and
      a first connector attached to a second end of the power input cable; and
   a power distribution rack comprising:
      a power distribution rack frame;
      a plurality of second connectors mounted on the power distribution rack frame at a face of the power distribution rack and configured to mate with the first connectors of the equipment racks; and
      a plurality of circuit interruption devices supported by the power distribution rack frame and electrically coupled to the second connectors, wherein the face of the power distribution rack is a rear face of the power distribution rack and wherein the circuit interruption devices comprise a plurality of circuit breakers accessible and mounted at a front face of the power distribution rack.

2. The system of claim 1, further comprising an uninterruptible power supply (UPS) rack comprising a UPS electrically coupled to the circuit interruption devices.

3. The system of claim 2, wherein the power distribution rack further comprises a bypass switch supported by the power distribution rack frame and electrically coupled to the circuit interruption devices and the UPS.

4. The system of claim 3, wherein the power distribution rack further comprises a transformer supported by the power distribution rack frame and electrically coupled to the bypass switch.

5. The system of claim 1, wherein each of the equipment racks includes a power distribution network supported by the equipment rack frame, electrically coupled to the first end of the power input cable and configured to distribute power to electronic equipment supported by the equipment rack frame.

6. The system of claim 5, wherein the power distribution network comprises a plurality of equipment power connectors configured to pluggably mate with power connectors of the electronic equipment, and wherein the power input cable is coupled to the plurality of equipment power connectors.

7. The system of claim 1, wherein the second connectors of the power distribution rack are visibly grouped according to at least one index.

8. The system of claim 1, wherein the power distribution and the equipment racks are arranged in a row, and wherein the power input cables have respective different lengths corresponding to respective different distances between the power distribution rack and the respective equipment racks.

9. A method of providing power distribution in an electronic system, the method comprising:
   providing a plurality of equipment racks, each comprising a equipment rack frame configured to receive and support electronic equipment, a power input cable having a first end fixedly attached to the equipment rack frame and configured to be electrically coupled to electronic equipment supported by the equipment rack frame and a first connector attached to a second end of the power input cable;
   providing a power distribution rack comprising a power distribution rack frame and a plurality of second connectors mounted on the power distribution rack frame at a face of the power distribution rack;
   pluggably mating the plurality of second connectors with the first connectors of the equipment racks;
   wherein the power distribution rack further comprises a plurality of circuit interruption devices supported by the power distribution rack frame and electrically coupled to the second connectors, wherein the face of the power distribution rack is a rear face of the power distribution rack and wherein the circuit interruption devices comprise a plurality of circuit breakers accessible and mounted at a front face of the power distribution rack.

10. The method of claim 9, further comprising providing an uninterruptible power supply (UPS) rack comprising a UPS, electrically coupling an output of the UPS to the circuit interruption devices, and electrically coupling the second connectors to the circuit interruption devices.

11. The method of claim 10, further comprising providing the power distribution rack with a bypass switch and electrically coupling the bypass switch to circuit interruption devices and to an input of the UPS.

12. The method of claim 11, further comprising providing the power distribution rack with a transformer, and electrically coupling the transformer between a power source and the bypass switch.

13. The method of claim 9, further comprising providing each of the equipment racks with a power distribution network supported by the equipment rack frame and electrically coupled to the first end of the power input cable.

14. The method of claim 13, wherein the power distribution network comprises a plurality of equipment power connectors configured to pluggably mate with power connectors of the electronic equipment, and wherein the power input cable is electrically coupled to the plurality of equipment power connectors.

15. The method of claim 9, further comprising grouping the second connectors of the power distribution rack according to at least one index.

16. The method of claim 9, further comprising arranging the power distribution and the equipment racks in a row, and configuring the power input cables to have respective different lengths corresponding to respective different distances between the power distribution rack and the respective equipment racks.

17. The system of claim 1, wherein plurality of circuit breakers and the plurality of second connectors are positioned in power distribution assembly configured to be mounted in the power distribution rack frame.

* * * * *